United States Patent [19]

Hayano

[11] Patent Number: 5,361,231

[45] Date of Patent: Nov. 1, 1994

[54] DYNAMIC RANDOM ACCESS MEMORY DEVICE WITH REDUNDANT WORD LINES SHARED BETWEEN MEMORY CELL ARRAYS

[75] Inventor: Kiminori Hayano, Kanagawa, Japan

[73] Assignee: NEC Corporation, Tokyo, Japan

[21] Appl. No.: 157,439

[22] Filed: Nov. 26, 1993

Related U.S. Application Data

[63] Continuation of Ser. No. 833,029, Feb. 10, 1992, abandoned.

[30] Foreign Application Priority Data

Feb. 8, 1991 [JP] Japan .................................. 3-37803

[51] Int. Cl.$^5$ .......................... G11C 7/00; G11C 13/00
[52] U.S. Cl. ............................ 365/200; 365/230.06; 371/10.1
[58] Field of Search .......................... 365/200, 230.06; 371/10.1, 10.2

[56] References Cited

U.S. PATENT DOCUMENTS

5,008,857 4/1991 Mizoguchi .......................... 365/200

Primary Examiner—Do Hyun Yoo
Attorney, Agent, or Firm—Sughrue, Mion, Zinn, Macpeak & Seas

[57] ABSTRACT

A dynamic random access memory device has a plurality of sense amplifier circuits shared between two regular memory cell arrays respectively associated with redundant memory cell arrays, and two transfer gate arrays are coupled between one of the regular memory cell arrays and one of the redundant memory cell arrays as well as between the other regular memory cell array and the other redundant memory cell array so that a large number of defective memory cells are replaceable with both of the redundant memory cell arrays, thereby improving production yield.

4 Claims, 3 Drawing Sheets

DYNAMIC RANDOM ACCESS MEMORY DEVICE WITH REDUNDANT WORD LINES SHARED BETWEEN MEMORY CELL ARRAYS

This is a continuation of application Ser. No. 07/833,029 filed Feb. 10, 1992, now abandoned.

FIELD OF THE INVENTION

This invention relates to a dynamic random access memory device and, more particularly, to a redundant technology applied to the dynamic random access memory device for rescuing from rejection.

DESCRIPTION OF THE RELATED ART

Figure 1:
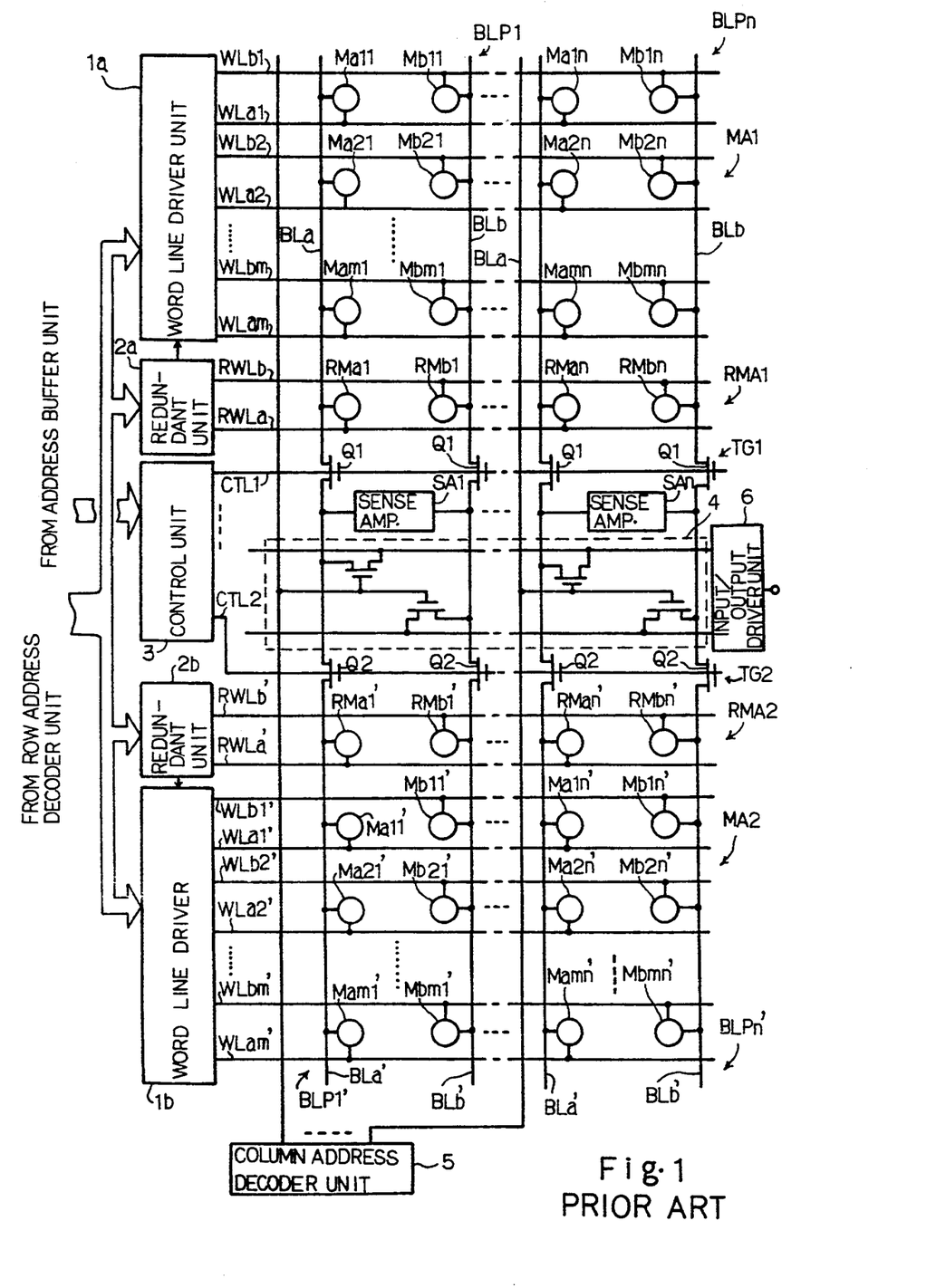
FIG. 1 is a circuit diagram showing the arrangement of the prior art dynamic random access memory device.

The integration density of a dynamic random access memory device has been continuously increased, however, the semiconductor chip for the dynamic random access memory device is expected not to be enlarged for maintaining the production yield, Shared sense amplifier circuits are effective against increase of the semiconductor chip, and FIG. 1 shows a typical example of the dynamic random access memory device equipped with the shared sense amplifier circuits. The prior art dynamic random access memory device has two regular memory cell arrays MA1 and MA2, and the regular memory cell arrays MA1 and MA2 are respectively associated with redundant memory cell arrays RMA1 and RMA2. The regular memory cell array MA1 associated with the redundant memory cell array RMA1 is located on the opposite side to the regular memory cell array MA2 associated with the redundant memory cell array RMA2 with respect to the sense amplifier circuits SA1 to SAn. A transfer gate array TG1 is coupled between the sense amplifier circuits SA1 to SAn and the redundant memory cell array RMA1, and another transfer gate array TG2 is provided between the sense amplifier circuits SA1 to SAn and the redundant memory cell array RMA2. The transfer gate arrays TG1 and TG2 selectively couple the regular memory cell arrays MA1 and MA2 respectively associated with the redundant memory cell arrays RMA1 and RMA2 with the sense amplifier circuits SA1 to SAn, and, for this reason, the sense amplifier circuits SA1 to SAn are shared between the two memory cell arrays MA1 and MA2.

The regular memory cell array MA1 is implemented by a plurality of memory cells Ma11, Mb11, Ma1n, Mb1n, Ma21, Mb21, Ma2n, Mb2n, Mam1, Mbm1, Mamn and Mbmn arranged in rows and columns. The regular memory cells are of the one-transistor one-capacitor type, i.e., a series combination of a switching transistor and a storage capacitor.

A plurality of regular word lines WLa1, WLb1, WLa2, WLb2, WLam and WLbm are associated with the rows of the regular memory cell arrays MA1, and are coupled with the gate electrodes of the associated switching transistors. The regular word lines WLa1 to WLbm are selectively driven by a word line driver unit 1a, and the word line driver unit 1a is responsive to decoded signals from a row address decoder unit (not shown) for selectively driving the regular word lines WLa1 to WLbm.

A plurality of bit line pairs BLP1 to BLPn are provided for the columns of the regular memory cell array MA1. Each of the bit line pairs BLP1 to BLPn is associated with two columns, and the bit lines BLa and BLb are coupled with the drain nodes of the switching transistors of the memory cells in the respective columns. When one of the word lines WLa1 to WLbm is driven to an active level, the storage capacitors of the associated memory cells are conducted to the bit lines BLa or BLb, and data bits are read out or written into the memory cells, respectively.

The redundant memory cell array RMA1 associated with the regular memory cell array MA1 is implemented by memory cells RMa1, RMb1, RMan and RMbn of the one-transistor and one-capacitor type, and two redundant word lines RWLa and RWLb are associated with the redundant memory cell array RMA1. Namely, the redundant word line RWLa is coupled with the gate electrodes of the switching transistors of the memory cells RMa1 to RMan, and the redundant word line RWLb is coupled with the gate electrodes of the switching transistors of the memory cells RMb1 to RMbn. The memory cells RMa1/ RMb1 to RMan/RMbn are respectively associated with the bit line pairs BLP1 to BLPn, and the bit lines BLa and BLb are coupled with the drain nodes of the switching transistors of the associated memory cells RMa1 to RMbn. The redundant word lines RWLa and RWLb are coupled with a redundant unit 2a, and are selectively driven by the redundant unit 2a upon access to a defective memory cell hardly maintaining a data bit. Namely, if a defective memory cell is found in a testing operation before delivery from the manufacturer, the manufacturer memorizes the row address assigned to the defective memory cell in the redundant unit 2a, and the word line coupled with the defective memory cell is replaced with one of the redundant word lines RWLa and RWLb through the memorization. After the replacement, if the defective memory cell is accessed from the outside thereof, the redundant unit 2a discriminates the row address assigned to the defective memory cell, and renders the word line driver unit 1a disenable to the decoded signals from the row address decoder unit. The redundant unit 2a is further operative to drive one of the word lines RWLa and RWLb, and the storage capacitors of the associated memory cells RMa1 to RMan or RMb1 to RMbn are conducted to the associated bit lines BLa or BLb instead of the defective memory cell.

The regular memory cell array MA2 is also implemented by a plurality of memory cells Ma11', Mb11', Ma1n', Mb1n', Ma21', Mb21', Ma2n', Mb2n', Mam1', Mbm1', Mamn' and Mbmn' of the one-transistor and one-capacitor type arranged in rows and columns.

A set of regular word lines WLa1', WLb1', WLa2', WLb2', WLam' and WLbm' are associated with the rows of the regular memory cell arrays MA2, and are coupled with the gate electrodes of the associated switching transistors. The regular word lines WLa1' to WLbm' are selectively driven by a word line driver unit 1b, and the word line driver unit 1b is responsive to the decoded signals from the row address decoder unit (not shown) for selectively driving the regular word lines WLa1' to WLbm'.

Another set of bit line pairs BLP1' to BLPn' are provided for the columns of the regular memory cell array MA2. Each of the bit line pairs BLP1' to BLPn' is associated with two columns, and the bit lines BLa' and BLb' are coupled with the drain nodes of the switching transistors of the memory cells in the respective columns. One of the rows of the regular memory cell array MA2 is driven by a selected regular word line, and data bits are also read out or written into the memory cells.

The redundant memory cell array RMA2 is also implemented by memory cells RMa1', RMb1', RMan' and RMbn' of the one-transistor and one-capacitor type, and two redundant word lines RWLa' and RWLb' are associated with the redundant memory cells RMA2. Namely, the redundant word line RWLa' is coupled with the gate electrodes of the switching transistors of the memory cells RMa1' to RMan', and the redundant word line RWLb' is coupled with the gate electrodes of the switching transistors of the memory cells RMb1' to RMbn'. The memory cells RMa1'/ RMb1' to RMan'/RMbn' are respectively associated with the bit line pairs BLP1' to BLPn', and the bit lines BLa' and BLb' are coupled with the drain nodes of the switching transistors of the associated memory cells RMa1' to RMbn'. The redundant word lines RWLa' and RWLb' are coupled with a redundant unit 2b, and are selectively driven by the redundant unit 2b upon access to a defective memory cell. Namely, if a defective memory cell is found in the regular memory cell array MA2, the manufacturer memorizes the row address assigned to the defective memory cell in the redundant unit 2b, and the word line coupled with the defective memory cell is replaced with one of the redundant word lines RWLa' and RWLb' through the memorization. After the replacement, if the defective memory cell is accessed from the outside thereof, the redundant unit 2b renders the word line driver unit 1b disenable to the decoded signals from the row address decoder unit, and drives one of the word lines RWLa' and RWLb', and the storage capacitors of the associated memory cells RMa1' to RMan' or RMb1' to RMbn' are conducted to the associated bit lines BLa' or BLb' instead of the defective memory cell.

The transfer gate arrays TG1 and TG2 are implemented by two parallel combinations of transfer transistors Q1 and Q2, respectively, and the gate electrodes of the transfer transistors Q1 and Q2 are coupled through control signal lines CTL1 and CTL2 with a control unit 3. The control unit 3 is responsive to an internal address bit, and one of the control lines CTL1 and CTL2 is driven to an active level so as to couple the bit line pairs BLP1 to BLPn or BLP1' to BLPn' with the sense amplifier circuits SA1 to SAn. The sense amplifier circuits SA1 to SAn develop differential voltage levels indicative of data bits, and one of the differential voltage levels is transferred through a column selector unit 4 under the control of a column address decoder unit 5 to an input/ output data driver unit 6 or through the selected transfer gate array TG1 or TG2 to the memory cell array MA1 or MA2.

A problem is encountered in the prior art dynamic random access memory device in that the redundant memory cell arrays RMA1 and RMA2 are too small to enhance the rescue. For example, if one of the rows of the regular memory cell array MA1 coupled with the bit lines BLa is defective, the memory cell RMa1 to RMan are responsible. Similarly, if one of the rows of the regular memory cell array MA1 coupled with the bit lines BLb is defective, the memory cells of the regular memory cell array MA1 are replaced with the memory cells RMb1 to RMbn, respectively. However, if two rows of the regular memory cell array MA1 coupled with either bit line BLa or BLb are defective, one of the rows can be replaced, however, the other row has no redundant memory cell. The other regular memory cell array MA2 is left in the similar situation.

Of course, if the number of redundant word lines is increased, most of the semiconductor chips would be perfectly rescued. However, the large redundant memory cell arrays occupy a large amount of real estate, and the semiconductor chips are enlarged only for the redundant technology.

SUMMARY OF THE INVENTION

It is therefore an important object of the present invention to provide a dynamic random access memory device which enhances production yield without sacrifice of the semiconductor chip size.

To accomplish the object, the present invention proposes to share a plurality of redundant memory cell arrays between a plurality of regular memory cell arrays.

In accordance with the present invention, there is provided a dynamic random access memory device fabricated on a single semiconductor chip, comprising: a) a plurality of regular memory cell arrays each implemented by a plurality of regular memory cells arranged in rows and columns; b) a plurality of regular word line groups respectively associated with the plurality of regular memory cell arrays, and each having a plurality of regular word lines respectively coupled with the rows of the regular memory cells of the associated regular memory cell array; c) a plurality of redundant memory cell arrays provided in association with the plurality of regular memory cell arrays, and each having a plurality of redundant memory cells arranged in rows and columns, rows of the regular memory cells being respectively replaceable with the rows of the redundant memory cells; d) a plurality of redundant word line groups respectively associated with the plurality of redundant memory cell arrays, and each having a plurality of redundant word lines respectively coupled with the rows of the redundant memory cells of the associated redundant memory cell array; e) a plurality of first bit lines associated with one of the plurality of regular memory cell arrays, and coupled with the columns of the regular memory cells of the aforesaid one of the regular memory cell arrays; f) a plurality of second bit lines associated with another regular memory cell array selected from the plurality of regular memory cell arrays, and coupled with the columns of the regular memory cells of the another regular memory cell array; g) a plurality of data line pairs respectively coupled with the columns of the redundant memory cells of one of the redundant memory cell arrays and with the columns of the redundant memory cells of another redundant memory cell array selected from the plurality of redundant memory cell arrays; h) a first transfer gate array coupled between the plurality of first bit lines and first end portions of the plurality of data line pairs where the aforesaid one of the redundant memory cell arrays is coupled; i) a second transfer gate array coupled between the plurality of second bit lines and second end portions of the data line pairs where the another redundant memory cell array is coupled; j) sense amplifier circuits respectively coupled with the plurality of data line pairs between the first end positions and the second end portions; and k) a control unit for shifting the first transfer gate array and the second transfer gate array between on and off states.

BRIEF DESCRIPTION OF THE DRAWINGS

The features and advantages according to the present invention will be more clearly understood from the following description taken in conjunction with the accompanying drawings in which.

DESCRIPTION OF THE PREFERRED EMBODIMENTS

First Embodiment

Figure 2:
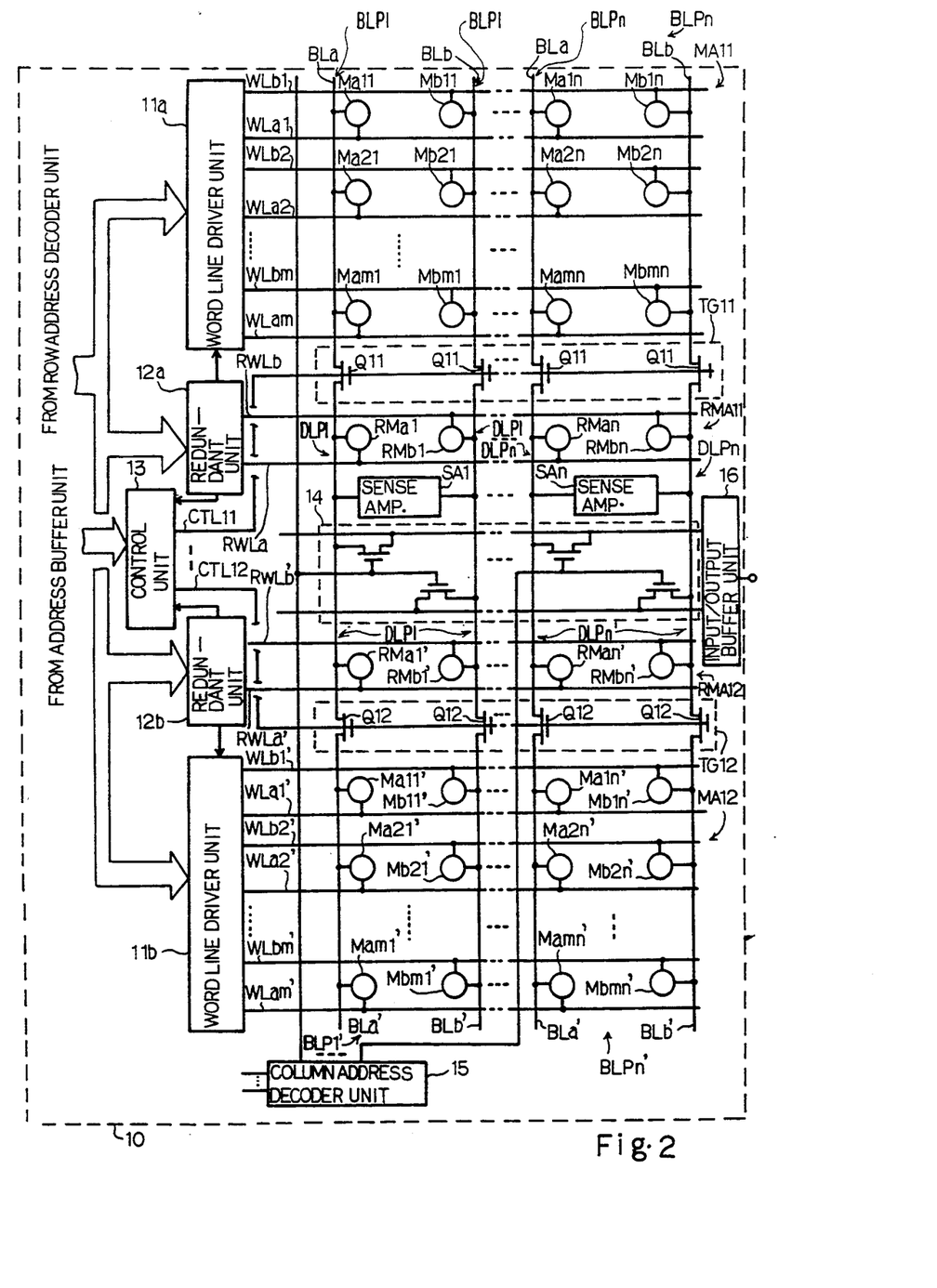
FIG. 2 is a circuit diagram showing the arrangement of a dynamic random access memory device according to the present invention.

Referring first to FIG. 2 of the drawings, a dynamic random access memory device embodying the present invention is fabricated on a single semiconductor chip 10, and comprises a plurality of regular memory cell arrays. However, only two regular memory cell arrays MA11 and MA12 and associated units and circuits are shown in FIG. 2 for the sake of simplicity. Description is hereinbelow focused upon the two regular memory cell arrays MA11 and MA12 and the associated units and circuits only, however, description on the other regular memory cell arrays and the associated units and circuits is analogous with the following description.

The regular memory cell arrays MA11 and MA12 are respectively associated with redundant memory cell arrays RMA11 and RMA12. The regular memory cell array MA11 is implemented by a plurality of regular memory cells Ma11, Mb11, Ma1n, Mb1n, Ma21, Mb21, Ma2n, Mb2n, Mam1, Mbm1, Mamn and Mbmn arranged in rows and columns. The regular memory cells Ma11 to Mbmn are of the one-transistor one-capacitor type, and, accordingly, each of the regular memory cells Ma11 to Mbmn is implemented by a series combination of a switching transistor and a storage capacitor.

A plurality of regular word lines WLa1, WLb1, WLa2, WLb2, WLam and WLbm are associated with the rows of the regular memory cell arrays MA11, and are coupled with the gate electrodes of the switching transistors of the associated regular memory cells. The regular word lines WLa1 to WLbm are selectively driven by a word line driver unit 11a, and the word line driver unit 11a is responsive to decoded signals from a row address decoder unit (not shown) for selectively driving the regular word lines WLa1 to WLbm.

A plurality of first bit line pairs BLP1 to BLPn are provided for the columns of the regular memory cell array MA11. Each of the bit line pairs BLP1 to BLPn is associated with two columns, and the bit lines BLa and BLb of each bit line pair are coupled with the drain nodes of the switching transistors of the associated regular memory cells. When one of the word lines WLa1 to WLbm is driven to an active level, the storage capacitors of the associated regular memory cells are conducted to the bit lines BLa or BLb, and data bits are read out or written into the regular memory cells, respectively.

The redundant memory cell array RMA11 associated with the regular memory cell array MA11 is implemented by redundant memory cells RMa1, RMb1, RMan and RMbn of the one-transistor and one-capacitor type, and two redundant word lines RWLa and RWLb are associated with the redundant memory cell array RMA11. Namely, the redundant word line RWLa is coupled with the gate electrodes of the switching transistors of the redundant memory cells RMa1 to RMan, and the redundant word line RWLb is coupled with the gate electrodes of the switching transistors of the redundant memory cells RMb1 to RMbn.

The redundant memory cells RMa1/RMb1 to RMan/RMbn are respectively associated with a plurality of data line pairs DLP1 to DLPn, and data lines of the data line pairs DLP1 to DLPn are selectively coupled with the drain nodes of the switching transistors of the associated redundant memory cells RMa1 to RMbn. The redundant word lines RWLa and RWLb are coupled with a redundant unit 12a, and are selectively driven by the redundant unit 12a upon access to a defective memory cell hardly maintaining a data bit. Namely, if a defective memory cell is found in a testing operation before delivery from the manufacturer, the manufacturer memorizes the row address assigned to the defective memory cell in the redundant unit 12a, and the word line coupled with the defective memory cell is replaced with one of the redundant word lines RWLa and RWLb through the memorization. The memorization of the row address is, by way of example, carried out through selective destruction of fuse elements. After the replacement, if the defective memory cell is accessed from the outside thereof, the redundant unit 12a discriminates the row address assigned to the defective memory cell, and renders the word line driver unit 11a disenable to the decoded signals from the row address decoder unit. The redundant unit 12a is further operative to drive one of the word lines RWLa and RWLb, and the storage capacitors of the associated redundant memory cells RMa1 to RMan or RMb1 to RMbn are conducted to the associated data lines instead of the defective memory cell.

The regular memory cell array MA12 is also implemented by a plurality of regular memory cells Ma11', Mb11', Ma1n', Mb1n', Ma21', Mb21', Ma2n', Mb2n', Mam1', Mbm1', Mamn' and Mbmn' of the one-transistor and one-capacitor type arranged in rows and columns.

A set of regular word lines WLa1', WLb1', WLa2', WLb2', WLam' and WLbm' are provided in association with the rows of the regular memory cell arrays MA12, and are coupled with the gate electrodes of the associated switching transistors. The regular word lines WLa1' to WLbm' are selectively driven by a word line driver unit 11b, and the word line driver unit 11b is responsive to the decoded signals from the row address decoder unit (not shown) for selectively driving the regular word lines WLa1' to WLbm'.

A set of second bit line pairs BLP1' to BLPn' are provided for the columns of the regular memory cell array MA12. Each of the bit line pairs BLP1' to BLPn' is associated with two columns, and the bit lines BLa' and BLb' are coupled with the drain nodes of the switching transistors of the regular memory cells in the respective columns. One of the rows of the regular memory cell array MA12 is driven by a selected regular word line, and the regular memory cells coupled thereto are also conducted to the bit line pairs BLP1' to BLPn'.

The redundant memory cell array RMA12 is also implemented by redundant memory cells RMa1', RMb1', RMan' and RMbn' of the one-transistor and one-capacitor type, and two redundant word lines RWLa' and RWLb' are associated with the redundant memory cells RMA12. Namely, the redundant word line RWLa' is coupled with the gate electrodes of the switching transistors of the redundant memory cells RMa1' to RMan', and the redundant word line RWLb' is coupled with the gate electrodes of the switching transistors of the redundant memory cells RMb1' to RMbn'.

The redundant memory cells RMa1'/RMb1' to RMan'/RMbn' are associated with the data line pairs DLP1' to DLPn', and the data lines of the data line pairs DLP1' and DLPn' are coupled with the drain nodes of the switching transistors of the associated redundant memory cells RMa1' to RMbn'. The redundant word lines RWLa' and RWLb' are coupled with a redundant unit 12b, and are selectively driven by the redundant unit 12b upon access to a defective memory cell as similar to the redundant word lines RWLa' and RWLb'.

In this instance, transfer gate arrays TG11 and TG12 are provided between the regular memory cell array MA11 and the redundant memory cell array RMA11 and between the regular memory cell array MA12 and the redundant memory cell array RMA12, and the transfer gate arrays TG11 and TG12 are implemented by parallel combinations of transfer transistors Q11 and Q12, respectively. The transfer transistors Q11 are coupled between the bit lines BLa and BLb of the bit line pairs BLP1 to BLPn and the data lines of the data line pairs DLP1 to DLPn, and the transfer transistors Q12 are coupled between the bit lines BLa' and BLb' of the bit line pairs BLP1' to BLPn' and the data line pairs DLP1' to DLPn'. The gate electrodes of the transfer transistors Q11 and Q12 are coupled through control signal lines CTL11 and CTL12 with a control unit 13. The control unit 13 is responsive to an internal address bit, and both of and one of the control lines CTL11 and CTL12 is driven to an active level so as to couple the bit line pairs BLP1 to BLPn and/or BLP1' to BLPn' with the data line pairs DLP1 to DLPn.

A plurality of sense amplifier circuits SA1 to SAn are coupled with the data line pairs DLP1 to DLPn, and develop differential voltage levels on the data line pairs DLP1 to DLPn. The data line pairs DLP1 to DLPn are further coupled with a column selector unit 14, and a column address decoder unit 15 is responsive to internal column address bits so that one of the differential voltage levels on the selected data line pair is transferred through the column selector unit 14 to an input/output data driver unit 16, directly to one of the redundant memory cells RMa1 to RMbn and RMa1' to RMbn' or through the selected transfer gate array TG11 or TG12 to the regular memory cell array MA11 or MA12.

The dynamic random access memory device thus arranged behaves as follows. First, if no defective memory cell is incorporated in any regular memory cell arrays MA11 and MA12, any row address is never memorized in the redundant units 12a and 12b. Therefore, all of the data bits are stored in the regular memory cell arrays MA11 and MA12. Assuming now that an external address signal designates the regular memory cell Ma11, the word line driver unit 11a drives the regular word line WLa1 to the active level, and the control unit 12a allows only the control signal line CTL11 to go up to the active level. In a write-in phase of operation, a data bit supplied from the input/output data buffer unit 16 through the column selector unit 14 is developed by the sense amplifier circuit SA1, and the differential voltage level indicative of the data bit is transferred from the data line pair DLP1 through the transfer gate array TG11 to the bit line pair BLP1. If the dynamic random access memory device enters the read-out phase of operation, data bit stored in the regular memory cells Ma11 to Ma1n put differential voltage levels on the bit line pairs BLP1 to BLPn, and the transfer gate array TG11 transfers the differential voltage levels from the bit line pairs BLP1 to BLPn to the data line pairs DLP1 to DLPn, respectively. After the transmission, the control unit 12a renders the transfer gate array TG11 off, and the sense amplifier circuits SA1 to SAn develop the differential voltage levels on the data line pairs DLP1 to DLPn. Since the sense amplifier circuits SA1 to SAn are isolated from the bit line pairs BLP1 to BLPn and BLP1' to BLPn', the sense amplifier circuits SA1 to SAn are expected to drive a relatively small amount parasitic capacitances, and, accordingly, complete the amplifications. The column address decoder unit 15 causes the column selector unit 14 to couple the data line pair DLP1 to the input/output data buffer unit 16, and the data bit read out from the regular memory cell Ma11 is supplied to the outside of the dynamic random access memory device.

If the external address signal is indicative of a regular memory cell of the regular memory cell array MA12, the word line driver unit 11ba, the control unit 13 and the column address decoder unit 15 allow one of the bit line pairs BLP1 ' to BLPn ' through the associated data line pair to the input/output data buffer unit 16, and no further description is incorporated hereinbelow for avoiding repetition.

If the regular memory cells Ma11 and Ma11' are, by way of example, defective, the row addresses assigned to the defective memory cells Ma11 and Ma11' are respectively memorized in the redundant units 12a and 12b. Assuming now that the external address signal is indicative of either defective memory cell Ma11 or Ma11' , the control unit 13 renders both transfer gate arrays TG1 1and TG12 off. The redundant unit 12a or 12b discriminates the row address, and disenables the word line driver unit 11a or 11b. The redundant unit 12a or 12b is further operative to drive the redundant word line RWLa or RWLa', and the redundant memory cells RMa1 to RMan or RMa1' to RMan' are coupled with the data line pairs DLP1 to DLPn, respectively. If the dynamic random access memory device is in the write-in phase, a data bit supplied from the input/output data buffer unit 16 is written into the redundant memory cell RMa1 or RMa1' instead of the defective memory cell Ma11 or Ma11'. On the other hand, if the dynamic random access memory device has entered in the read-out phase of operation, the data bits stored in the redundant memory cells RMa1 to RMan or RMa1' to RMan' produce differential voltage levels on the data line pairs DLP1 to DLPn, and the differential voltage levels are developed by the sense amplifier circuits SA1 to SAn. The column selector 14 transfers the differential voltage level on the data line pair DLP1 to the input/output data abuffer unit 16, and an output data signal indicative of the data bit stored in the redundant memory cell RMa1 or RMa1' is supplied to the outside.

If the regular memory cells Ma11 and Ma21 are found to be defective, the prior art dynamic random access memory device hardly copes with the situation. However, the dynamic random access memory device embodying the present invention memorizes the row addresses assigned to the defective memory cells Ma11 and Ma21 in the redundant units 12a and 12b. Assuming now that the external address signal is indicative of either defective memory cell Ma11 or Ma21, the control unit 13 also renders both transfer gate arrays TG11 and TG12 off. The redundant unit 12a or 12b discriminates the row address, and the word line driver unit 11a or 11b. The redundant unit 12a or 12b is further operative to drive the redundant word line RWLa or RWLa', and the redundant memory cells RMa1 to RMan or RMa1' to RMan' are coupled with the data line pairs DLP1 to DLPn, respectively. If the dynamic random access memory device is in the write-in phase, a data bit supplied from the input/output data buffer unit 16 is written into the redundant memory cell RMa1 or RMa1' instead of the defective memory cell Ma11 or Ma21. On the other hand, if the dynamic random access memory device has entered in the read-out phase of operation, the data bits stored in the redundant memory cells RMa1 to RMan or RMa1' to RMan' produce differential voltage levels on the data line pairs DLP1 to DLPn, and the differential voltage levels are developed by the sense amplifier circuits SA1 to SAn. The column selector 14 transfers the differential voltage level on the data line pair DLP1 to the input/output data buffer unit 16, and an output data signal indicative of the data bit stored in the redundant memory cell RMa1 or RMa1' is supplied to the outside.

As will be understood from the foregoing description, the dynamic random access memory device according to the present invention can replace the redundant memory cells with defective memory cells in either of or both of the regular memory cell arrays, and inferior products are effectively rescued from rejection. This results in enhancement of the production yield.

Second Embodiment

Figure 3:
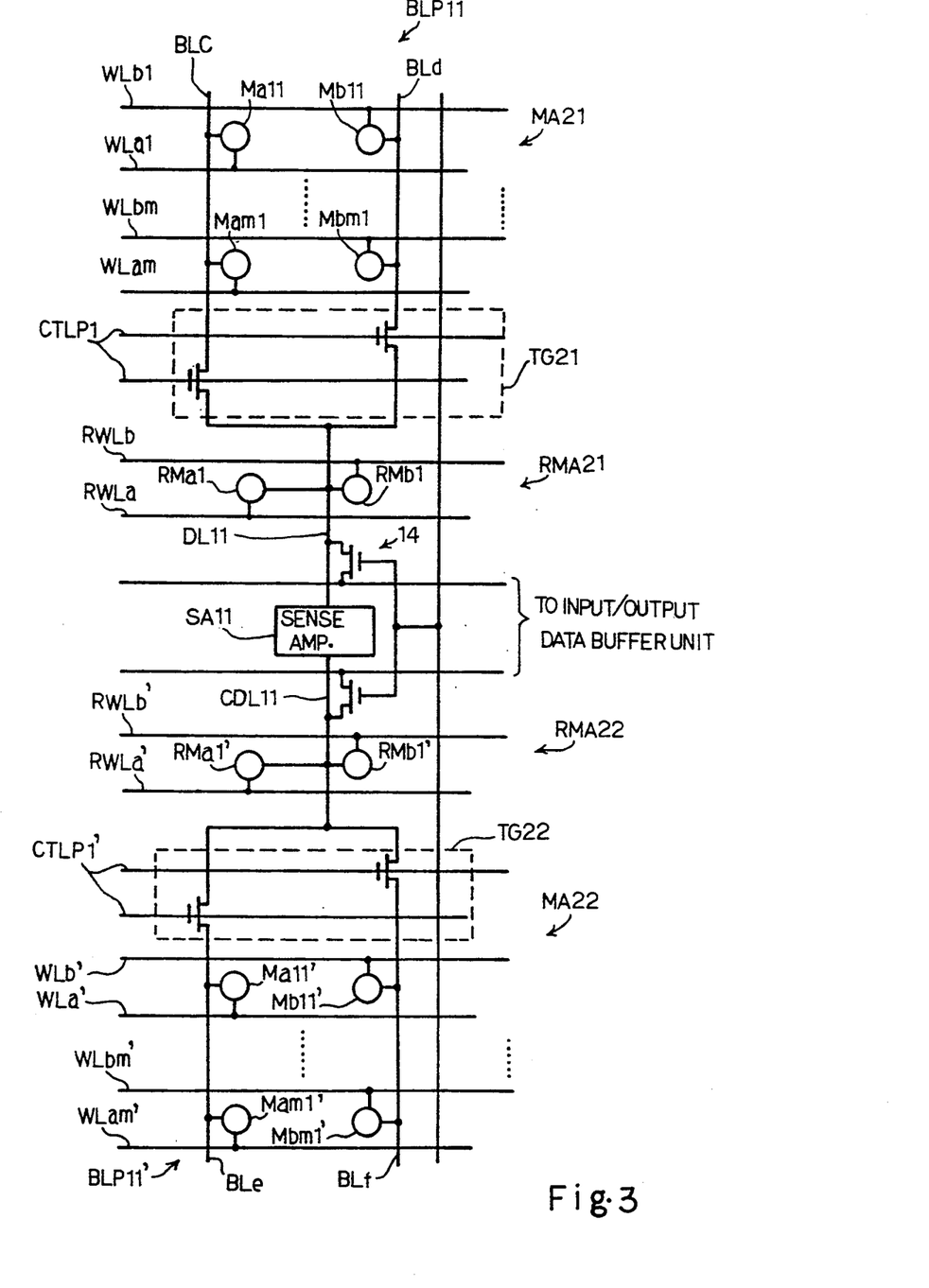
FIG. 3 is a circuit diagram showing the arrangement of another dynamic random access memory device according to the present invention.

Turning to FIG. 3 of the drawings, another dynamic random access memory device embodying the present invention is illustrated. FIG. 3 shows only a bit line pair BLP11 associated with a regular memory cell array MA21 as well as a bit line pair BLP11' associated with another regular memory cell array MA22. However, the dynamic random access memory device implementing the second embodiment has other memory cell arrays as well as peripheral circuits thereof.

A difference between the first and second embodiments is the bit lines coupled with a sense amplifier circuit SA11. In the first embodiment, the bit line pairs BLP1 to BLPn or BLP1' to BLPn' are coupled through the associated data line pair with the associated sense amplifier circuit. However, the dynamic random access memory device shown in FIG. 3 couples one of the bit lines BLc and BLd of the bit line pair BLP11 as well as one of the bit lines BLe and BLf of the bit line pair BLP11' with the associated sense amplifier circuit SA11, and transfer gate arrays TG21 and TG22 are gated by pairs of control signal lines CTLP1 and CTLP1'. Each pair of control signal lines propagate a control signal and the complementary signal thereof so as to select bit lines BLc/BLf or BLd/BLe from the bit line pairs BLP11 and BLP11'. The transfer gate arrays TG21 and TG22 are provided between the regular memory cell arrays MA21 and MA22 and redundant memory cell arrays RMA21 and RMA22, and data lines DL11 and CDL11 are coupled between the transfer gate arrays TG21 and TG22 and the sense amplifier circuit SA11. Therefore, the advantages of the first embodiments are also achieved by the dynamic random access memory device implementing the second embodiment. Component cells and lines are labeled with the same references used for the first embodiment without detailed description.

Although particular embodiments of the present invention have been shown and described, it will be obvious to those skilled in the art that various changes and modifications may be made without departing from the spirit and scope of the present invention. For example, each of the redundant memory cell arrays may have more than 2 n redundant memory cells. Moreover, the peripheral units and circuits may be coupled in a different manner.

What is claimed is:

1. A dynamic random access memory device fabricated on a single semiconductor chip, comprising:
 a) a plurality of regular memory cell arrays each implemented by a plurality of regular memory cells arranged in rows and columns;
 b) a plurality of regular word line groups respectively associated with said plurality of regular memory cell arrays, and each regular word line group having a plurality of regular word lines respectively coupled with the rows of said regular memory cells of said associated regular memory cell array;
 c) a plurality of redundant memory cell arrays provided in association with said plurality of regular memory cell arrays, and each redundant memory cell array having a plurality of redundant memory cells arranged in rows and columns, the rows of said regular memory cells incorporated in one of said plurality of regular memory cell arrays and another of said plurality of regular memory cell arrays being respectively replaceable with the rows of said redundant memory cells in one of said plurality of redundant memory cell arrays and another of said plurality of redundant memory cell arrays;
 d) a plurality of redundant word line groups respectively associated with said plurality of redundant memory cell arrays, and each redundant word line group having a plurality of redundant word lines respectively coupled with the rows of said redundant memory cells of said associated redundant memory cell array;
 e) a plurality of first bit line pairs associated with said one of said plurality of regular memory cell arrays, and respectively coupled with the columns of said regular memory cells of said one of said plurality of regular memory cell arrays;
 f) a plurality of second bit line pairs associated with said another regular memory cell array, and respectively coupled with the columns of said regular memory cells of said another regular memory cell array;
 g) a plurality of data line pairs having first end portions respectively coupled with the columns of said redundant memory cells of said one of said redundant memory cell arrays and second end portions respectively coupled with the columns of said redundant memory cells of said another redundant memory cell array;
 h) a first transfer gate array coupled between said one regular memory cell array and said one redundant memory cell array;
 i) a second transfer gate array coupled between said another regular memory cell array and said another redundant memory cell array;
 j) sense amplifier circuits respectively coupled with said plurality of data line pairs between said first end positions and said second end portions; and k) a control unit operative to shift said first transfer gate array to an on-state for interconnecting said plurality of first bit line pairs and said plurality of data line pairs and to shift said second transfer gate array to an off-state for isolating said plurality of data line pairs from said plurality of second bit line pairs when said regular word lines associated with said one of said plurality of regular memory cell arrays are selectively driven to an active level, said control unit being further operative to shift said first transfer gate array to the off-state for isolating said plurality of first bit line pairs from said plurality of data line pairs and to shift said second transfer gate array to the on-state for interconnecting said plurality of second bit line pairs and said plurality of data line pairs when said regular word lines associated with said another regular memory cell array are selectively driven to said active level, said control unit being further operative to simultaneously shift said first transfer gate array and said second transfer gate array to the off-state when the redundant word lines associated with said one redundant memory cell array and said another redundant memory cell array are selectively driven to the active level.

2. A dynamic random access memory device as set forth in claim 1, in which said dynamic random access memory device further comprises 1) a plurality of redundant units respectively coupled with said plurality of redundant word line groups, and each redundant unit operative to selectively drive the redundant word lines of said coupled redundant word line group, said plurality of redundant units including first and second redundant units respectively associated with said one of said redundant memory cell arrays and said another redundant memory cell array, each of said first and second redundant units being capable of storing row addresses assigned to regular word lines selected from said regular word lines associated with said respective regular memory cell arrays respectively coupled with said plurality of first bit line pairs and said plurality of second bit line pairs.

3. A dynamic random access memory device as set forth in claim 2, in which said control unit is operative to allow said first and second transfer gate arrays to simultaneously turn off when one of said first and second redundant units drives one of said redundant word lines associated with said one of said plurality of redundant memory cell arrays and with said another redundant memory cell array.

4. A dynamic random access memory device as set forth in claim 3, in which each of said data line pairs is connectable through said first transfer gate array with one of said plurality of first bit line pairs and through said second transfer gate array with one of said plurality of second bit line pairs.

* * * * *

UNITED STATES PATENT AND TRADEMARK OFFICE
CERTIFICATE OF CORRECTION

PATENT NO. : 5,361,231
DATED : November 1, 1994
INVENTOR(S) : Kiminori Hayano

It is certified that error appears in the above-indentified patent and that said Letters Patent is hereby corrected as shown below:

Column 5, line 29, delete "RMA1I", and insert --KMA11--;

Column 8, line 22, delete "11ba", and insert --11b--.

Signed and Sealed this

Eleventh Day of April, 1995

*Attest:*

BRUCE LEHMAN

*Attesting Officer    Commissioner of Patents and Trademarks*